(12) United States Patent
Giolbas et al.

(10) Patent No.: US 11,860,203 B2
(45) Date of Patent: Jan. 2, 2024

(54) DUAL CHANNEL DIFFERENTIAL SENSOR

(71) Applicant: Kyocera AVX Components (Werne) GmbH, Werne (DE)

(72) Inventors: Rafael Giolbas, Lunen (DE); Marius Gloger, Hagen (DE); David Witts, Cambridge (GB)

(73) Assignee: Kyocera AVX Components (Werne) GmbH, Werne (DE)

( * ) Notice: Subject to any disclaimer, the term of this patent is extended or adjusted under 35 U.S.C. 154(b) by 175 days.

(21) Appl. No.: 17/488,474

(22) Filed: Sep. 29, 2021

(65) Prior Publication Data

US 2022/0170969 A1    Jun. 2, 2022

Related U.S. Application Data

(60) Provisional application No. 63/119,169, filed on Nov. 30, 2020.

(51) Int. Cl.
*G01R 25/00*    (2006.01)

(52) U.S. Cl.
CPC .................................. *G01R 25/00* (2013.01)

(58) Field of Classification Search
CPC ....................................................... G01R 25/00
USPC .......................................... 324/76.11, 76.77
See application file for complete search history.

(56) References Cited

U.S. PATENT DOCUMENTS

| | | | |
|---|---|---|---|
| 3,967,064 A | 6/1976 | Sigworth | |
| 4,127,813 A * | 11/1978 | Hiroshima | G01N 27/9046 250/214 AG |
| 4,700,129 A * | 10/1987 | Yoshizawa | G01R 25/06 324/76.77 |
| 5,619,446 A * | 4/1997 | Yoneda | G11C 15/04 711/158 |
| 6,977,982 B2 * | 12/2005 | Ma | G11B 7/0906 |
| 7,099,218 B2 * | 8/2006 | Wicht | G11C 7/062 365/207 |
| 7,205,775 B2 | 4/2007 | Kreit | |
| 7,514,919 B2 | 4/2009 | James et al. | |

(Continued)

FOREIGN PATENT DOCUMENTS

| | | | | |
|---|---|---|---|---|
| CN | 2082868 U | * | 8/1991 | ............... H02H 3/26 |
| EP | 3009804 | | 4/2016 | |

(Continued)

OTHER PUBLICATIONS

International Search Report for Application No. PCT/IB2021/058944, dated Dec. 10, 2021, 5 pages.

*Primary Examiner* — Hoai-An D. Nguyen
(74) *Attorney, Agent, or Firm* — Dority & Manning, P.A.

(57) ABSTRACT

A dual channel differential can include a first channel, the first channel configured to produce a first component signal, and a second channel that is independent from the first channel, the second channel configured to produce a second component signal. The sensor can include a sensing circuit configured to obtain the first component signal and the second component signal, the first component signal having a first polarity and the second component signal having a second polarity, the second polarity opposing the first polarity, determine a first cross-channel differential signal based at least in part on the first component signal and the second component signal, and provide the first cross-channel differential signal as a first output of the dual channel differential sensor.

13 Claims, 6 Drawing Sheets

(56) References Cited

U.S. PATENT DOCUMENTS

| | | | |
|---|---|---|---|
| 7,868,609 B2 | 1/2011 | Zhitomirskiy | |
| 2011/0089930 A1* | 4/2011 | Eckrich | G01D 3/063 |
| | | | 324/76.77 |
| 2020/0132874 A1 | 4/2020 | Witts et al. | |
| 2021/0055135 A1 | 2/2021 | Smith et al. | |
| 2021/0372823 A1 | 12/2021 | Witts et al. | |
| 2021/0381853 A1 | 12/2021 | Witts et al. | |

FOREIGN PATENT DOCUMENTS

| | | |
|---|---|---|
| WO | WO 2005055426 A2 | 6/2005 |
| WO | WO 2018/237402 | 12/2018 |

* cited by examiner

DUAL CHANNEL DIFFERENTIAL SENSOR

PRIORITY CLAIM

The present application claims the benefit of priority of U.S. Provisional App. No. 63/119,169, titled "Dual Channel Differential Sensor," having a filing date of Nov. 30, 2020, which is incorporated by reference herein.

FIELD

The present disclosure relates generally to dual channel differential sensors, such as sensors that produce dual channel sinusoidal outputs.

BACKGROUND

Dual channel differential sensors can produce outputs in response to a sensing input. For instance, the outputs can be differential sinusoidal signals. For instance, external stimuli or other conditions to be sensed, such as an electromagnetic field, can produce sinusoidal outputs on two independent channels at the differential sensors. A sensor can interact with a target and changes induced by the target can be measured at the sensor.

SUMMARY

Aspects and advantages of embodiments of the present disclosure will be set forth in part in the following description, or may be learned from the description, or may be learned through practice of the embodiments.

One example aspect of the present disclosure is directed to a dual channel differential sensor. The dual channel differential sensor can include a first channel, the first channel configured to produce a first component signal. The dual channel differential sensor can include a second channel that is independent from the first channel, the second channel configured to produce a second component signal. The dual channel differential sensor can include a sensing circuit. The sensing circuit can be configured to obtain the first component signal and the second component signal, the first component signal having a first polarity and the second component signal having a second polarity, the second polarity opposing the first polarity. The sensing circuit can be configured to determine a first cross-channel differential signal based at least in part on the first component signal and the second component signal. The sensing circuit can be configured to provide the first cross-channel differential signal as a first output of the dual channel differential sensor.

Another example aspect of the present disclosure is directed to a method for operating a dual channel differential sensor. The method can include obtaining a first component signal from a first channel of a dual channel differential sensor and a second component signal from a second channel of the dual channel differential sensor, the first component signal having a first polarity and the second component signal having a second polarity, the second polarity opposing the first polarity. The method can include determining a first cross-channel differential signal based at least in part on the first component signal and the second component signal. The method can include providing the first cross-channel differential signal as an output of the dual channel differential sensor.

These and other features, aspects and advantages of various embodiments will become better understood with reference to the following description and appended claims.

The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1A:
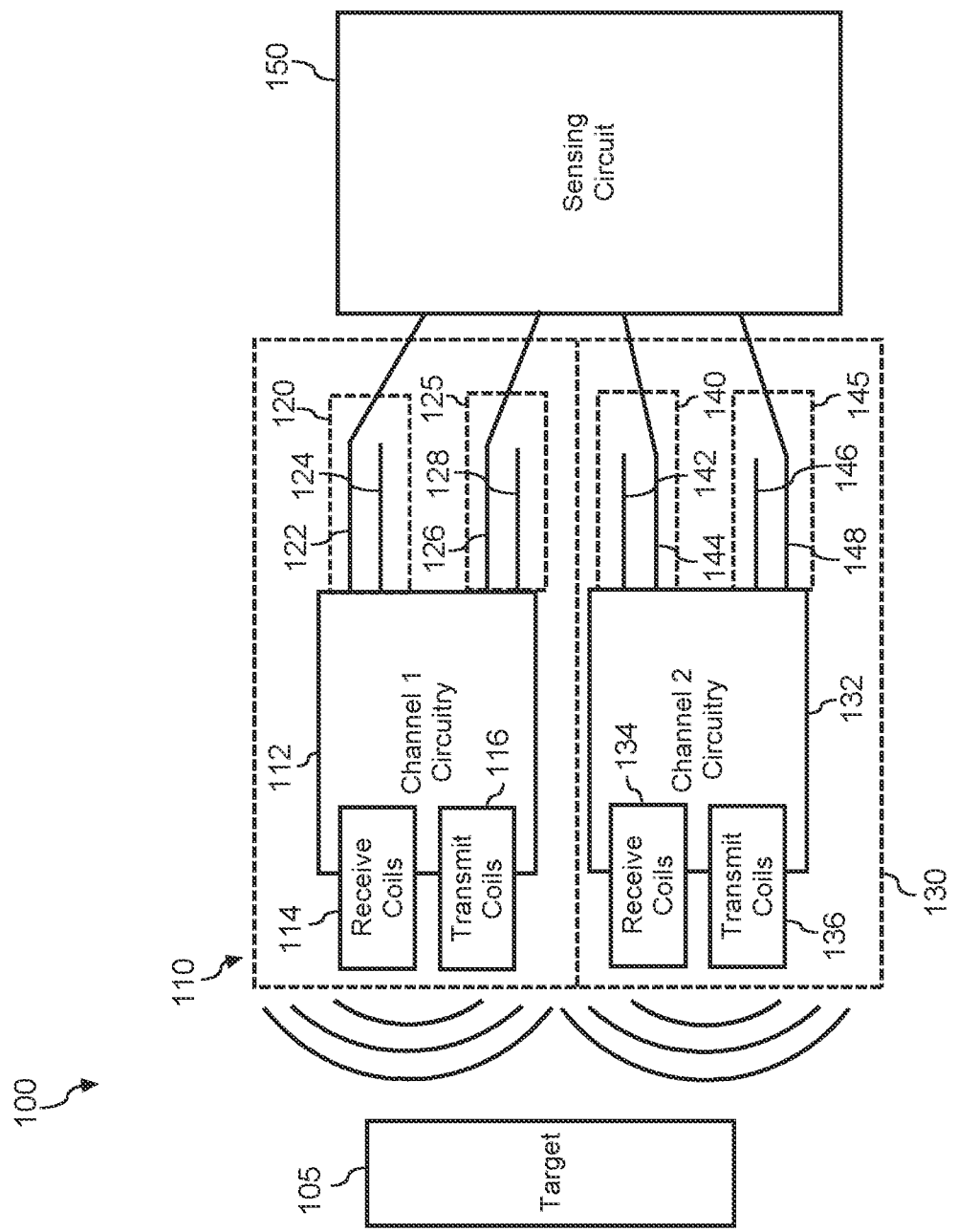
FIG. 1A depicts a block diagram of at least a portion of an example dual channel differential sensor according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to dual channel differential sensors, such as sensors that produce dual channel differential signals, such as sinusoidal outputs. As examples, the sensors can be or can include inductive sensors, such as inductive position sensors (e.g., rotational position sensors), inductive motor sensors, inductive gearbox sensors, magnetic encoders, and/or control systems such as electronic brake boosters, electronic brake systems, steering systems, torque control systems, and/or any other suitable sensor configured to produce differential signals. For instance, the sensors can produce differential signals in response to suitable stimuli, characteristics, phenomena, and/or other targets that the sensors are configured to measure. As one example, the sensors may be configured to measure position and/or movement of a target (e.g., rotational motion of the target) by measuring interaction of the target with the sensor through electromagnetic induction.

As used herein, a "differential signal" includes at least a correlated pair of component signals. The component signals can be combined (e.g., additively and/or subtractively combined with respect to polarity) to produce the differential signal. The component signals can be electrical signals, such as analog signals and/or digital signals. For example, the component signals can be or can include electrical signals such as voltage signals, current signals, etc. As one example, the component signals can be measured and/or sampled from a coil, such as a sinusoidal coil.

The dual channel differential sensors can include two (or more) independent channels that convey redundant, related and/or identical information. Although, conventionally, sensors may at least partially operate with information from only one channel (e.g., a single channel may capture all information needed for an intended measurement by the sensor), including two or more channels conveying correlated, redundant, and/or otherwise corroborating information can provide for a number of improvements in sensor functionality, such as, for example, improved reliability and/or robustness. For instance, information from a first channel can be cross-checked against information from a second channel to verify desired operation of the sensor. As another example, including two or more channels can provide improved safety of the sensors and/or systems operating based on sensor measurements. For example, disagreement between the channels can be indicative of a fault condition and/or otherwise undesirable operation (e.g., miscalibration) in a larger system (e.g., a motor). For instance, disagreement between the channels (e.g., greater than a certain tolerance) may be used in triggering a warning, fault resolution action, braking action, shutdown, etc., and may be provided to a technician or other individual for troubleshooting and/or repair, and/or provided in other suitable manners to ensure safe and reliable operation of a system.

Additionally and/or alternatively, differential signals can provide improved noise tolerance of a sensor. For example, sensors and/or systems employing the sensors can include components, such as lengths of wiring, that are sensitive to electromagnetic interference and/or other forms of noise present in an environment during operation of the sensor. As one example, some sensors can be vulnerable to common mode noise. Differential signals can be beneficial in mitigating effects of common mode noise.

However, including differential signals and/or two or more channels can contribute to increased cabling required to convey outputs from the sensor. For example, each differential signal can require two or more signal lines to convey the output. If each channel produces two differential signals (e.g., sine and cosine), then each channel can require four signal lines. Thus, a dual channel differential sensor can require eight or more signal lines coupled to the sensor and/or otherwise included within the sensor to communicate all information from the signals. This increased cabling can contribute to increased manufacturing, operating, and/or maintenance costs, decreased reliability (e.g., greater chance of line breakage, loose connections, etc.), increased sensitivity to electromagnetic interference, noise, cross-talk, etc., and/or other disadvantages. Thus, it can be desirable to decrease a number of signal lines required to communicate information from a dual channel differential sensor while maintaining most or all benefits associated with the dual channel differential sensor, such as increased safety, reliability, and/or noise tolerance, especially in safety-critical applications (e.g., vehicle control).

One solution to this problem is to use only single-ended outputs including one of each pair of component signals having common polarity, such as only sine+ and/or cosine+ signals, from each channel. This approach can reduce a total number of signal lines, as it requires only four signal lines including, for example, a sine+ and cosine+ from each channel. However, this approach effectively removes the differential characteristic of the signals. Thus, this approach can be vulnerable to electrical noise, such as common mode noise.

According to example aspects of the present disclosure, a dual channel differential sensor can be configured to experience reduced cabling while maintaining advantages of the dual channel differential sensor, including safety, reliability, and noise tolerance. The dual channel differential sensor can be any one or more of an inductive sensor, an inductive motor sensor, an inductive gearbox sensor, an inductive position sensor, a magnetic encoder, an electronic brake booster, an electronic brake system, a steering system, a torque control system, and/or any other suitable dual channel differential sensor in accordance with example aspects of the present disclosure.

The dual channel differential sensor can include a first channel and a second channel. The second channel can be independent from the first channel. The first channel can be configured to produce a first component signal. Additionally and/or alternatively, the second channel can be configured to produce a second component signal. The first component signal can have a first polarity and the second component signal can have a second polarity. The second polarity can oppose the first polarity. As used herein, a polarity can refer to a designed interpretation of the signals (e.g., a cross-channel differential signal labeled as positive or negative by convention). Additionally and/or alternatively, opposing polarity can refer to a phase difference of about 180 degrees and/or greater than about 90 degrees when accounting for designed phase differences between the channels and/or between the signals (e.g., channel phase differences and/or output phase differences). For example, a sine signal having a first polarity may be about 90 degrees out of phase with a cosine signal having a same polarity by virtue of convention. As another example, a sine signal from a first channel may be about 135 degrees out of phase with a cosine signal having a same polarity from a second channel having a 45 degree channel phase offset with the first channel. For instance, the phase offset may be greater than 90 degrees with a common polarity due to the channel phase offset. As used herein, polarity is intended to refer to differential relationships between the signals, and is not necessarily related to a polarity of values of the signals (e.g., a component signal with negative polarity may still have a positive value at some or all points).

According to example aspects of the present disclosure, the differential sensor can determine a cross-channel differential signal based at least in part on the first component signal and the second component signal and provide the first cross-channel differential signal as an output of the dual channel differential sensor. For example, the cross-channel differential signal can be formed from component signals from independent channels, which can provide for improved robustness, safety, noise tolerance (e.g., common mode noise tolerance) and/or other advantages associated with a plurality of channels while providing a reduced cabling (e.g., requiring only two signals instead of four).

As used herein, a "channel" refers to any suitable system for conveying enough information to perform desired measurements using the differential sensor, such as signal lines, circuitry, coils, etc. For instance, in some embodiments, each channel can include one or more coils (e.g., receive coil(s) and/or transmit coil(s)), channel circuitry configured to energize and/or measure a signal at the coil(s) (e.g., a coil signature) and/or produce component signals based on the measured signals (e.g., coil signatures), and/or one or more signal lines to transmit differential signals (e.g., component signals).

In some embodiments, each channel can produce one or more component signals associated with one or more differential signals. For example, in some embodiments, a channel can produce at least one component signal for each of at least two distinct differential signals, such as, for example, a sine differential signal and a cosine differential signal. For instance, a first channel may produce a component signal associated with a first differential signal (e.g., a sine differential signal) and a second differential signal (e.g., a cosine differential signal). In some embodiments, only one of a pair of component signals associated with each differential signal may be produced by a single channel. A corresponding component signal from a second channel can be used with the component signal from the first channel to produce a cross-channel differential signal. For instance, in some embodiments, a first component signal from a first channel and a second component signal from a second can be sine signals and/or the first cross-channel differential signal can be a sine differential signal. For example, a sine+signal from a first channel can be combined with a sine- signal from a second channel to produce a cross-channel sine differential signal.

For example, in some embodiments, a first channel can be configured to produce a third component signal. The third component signal can have a first polarity (e.g., a same polarity as a first component signal from the first channel). Additionally and/or alternatively, a second channel can be configured to produce a fourth component signal. The fourth component signal can have a second polarity (e.g., a same polarity as a second component signal from the second channel). The third component signal and the fourth component signal can be used to determine a second cross-channel differential signal based at least in part on the third component signal and the fourth component signal. The second cross-channel differential signal can be provided (e.g., in addition to the first cross-channel differential signal) as an output of the dual channel differential sensor. For instance, in some embodiments, the third component signal and the fourth component signals can be cosine signals and/or the second cross-channel differential signal can be a cosine differential signal. For example, a cosine+ signal from a first channel can be combined with a cosine− signal from a second channel to produce a cross-channel cosine differential signal. The cross-channel cosine differential signal may be about 90 degrees out of phase with the cross-channel sine differential signal.

Thus, in some embodiments, the component signals from the first channel can be positive component signals (e.g., sine+ and/or cosine+ signals) and the component signals from the second channel can be negative component signals (e.g., sine− and/or cosine− signals). Additionally and/or alternatively, one positive component signal and/or one negative component signal from each of the first channel and the second channel can be used.

In some embodiments, the sensor can further be configured to determine an output angle based at least in part on the first cross-channel differential signal and the second cross-channel differential signal. For instance, in some embodiments, the output angle can be a two-argument arctangent of the first cross-channel differential signal and/or the second cross-channel differential signal. For example, in some embodiments, the output angle can be determined by arctan 2($SIN_{out}$, $COS_{out}$), where $SIN_{out}$ is the first cross-channel differential signal (e.g., a sine differential signal) and $COS_{out}$ is the second cross-channel differential signal (e.g., a cosine differential signal).

In some embodiments, one or both of the first channel and/or the second channel can include one or more coils configured to interact with a target and produce one or more coil signatures in response to interaction with the target. In some embodiments, the coil(s) can be or can include a receive coil and/or a transmit coil. For example, the coil signatures can be receive signals measured from and/or sampled from a receive coil, which may be produced in response to a transmit signal at a transmit coil. In some embodiments, the coil(s) can be or can include sinusoidally shaped coils (e.g., sinusoidal receive coils). For example, a shape of the coil can be designed to produce a sinusoidal component signal in response to rotational motion, linear motion, and/or other desired motion of a target. In some embodiments, the coil(s) are rotationally offset around a central axis. For example, the coil(s) can be rotationally offset by a channel phase difference (e.g., between channels) and/or an output phase difference (e.g., between each differential signal in a channel). In some embodiments, the channel phase difference can be negligible (e.g., about zero degrees, such as less than about 5 degrees).

Additionally and/or alternatively, the channel(s) can include channel circuitry configured to produce component signals of one or more differential signals in response to the one or more coil signatures. The channel circuitry can be independently provided for each channel. For example, channel circuitry associated with the first channel can be disposed in a first integrated circuit (IC), such as an application-specific integrated circuit (ASIC), and channel circuitry associated with the second channel can be disposed in a second integrated circuit. The second integrated circuit can be different from (e.g., a separate IC from) the first integrated circuit. For example, in some embodiments, the channel circuitry can be configured to process the coil signatures and produce a sinusoidal component signal where a phase of the sinusoidal component signal corresponds to a rotational orientation and/or position of a target. For example, in some embodiments, the first component signal and the second component signal can be sinusoidal signals (e.g., sine signals) and the third component signal and the fourth component signals can be sinusoidal signals (e.g., cosine signals) that are phase shifted relative to the first component signal and the second component signal.

Additionally and/or alternatively, the channel(s) can include an interface configured to provide one of the first differential signal and the second differential signal (e.g., of the first channel) or the third differential signal and the fourth differential signal (e.g., of the second channel), such as one or both component signals thereof. For example, the channel(s) can each include an interface including one or more signal lines configured to provide pairs of signals associated with the differential signals. In some embodiments, the sensor may include an interface with signal lines and/or couplings only for utilized signals (e.g., one of each pair, as described herein). In some embodiments, the sensor may include an interface with signal lines and/or couplings for each signal, and connections may be made only with desired signals, to reduce cabling as described herein.

In some implementations, each of the channels can be configured to produce one or both component signals of two differential signals. For instance, the first channel can produce one or both component signals associated with a first differential signal and a second differential signal. Additionally and/or alternatively, the second channel can produce one or both component signals associated with a third differential signal and a fourth differential signal. The third differential signal can correspond with the first differential signal. For example, the third differential signal may convey identical, redundant, or otherwise corroborating information to the first differential signal. Additionally and/or alternatively, the fourth differential signal can correspond with the second differential signal. For example, the fourth differential signal may convey identical, redundant, or otherwise corroborating information to the second differential signal. As one example, both the first differential signal and the third differential signal can be a sine output. Additionally and/or alternatively, both the second differential signal and the fourth differential signal can be a cosine output.

For instance, each of the differential signals can include a pair of component signals. For example, the first differential signal can include a first pair of component signals. Additionally and/or alternatively, the second differential signal can include a second pair of component signals. Additionally and/or alternatively, the third differential signal can include a third pair of component signals. The third pair of component signals can correspond to the first pair of component signals. For instance, in some embodiments, the third pair of component signals can be nearly equivalent to and/or equivalent to the first pair of component signals and/or a phase-shifted first pair of component signals. Additionally and/or alternatively, the fourth differential signal can include a fourth pair of component signals. The fourth pair of component signals can correspond to the second pair of component signals. For instance, in some embodiments, the fourth pair of component signals can be nearly equivalent to and/or equivalent to the second pair of component signals and/or a phase-shifted second pair of component signals. The sensor may be configured to produce and/or make available for measurement one or both of each pair of component signals. For example, in some implementations, one of each pair of component signals can be omitted from production and the sensor can be configured to experience reduced cabling as described herein.

Each component signal of a pair of component signals can have an associated polarity. For example, a first signal of the pair of component signals can have a first polarity (e.g., positive), and a second signal of the pair of component signals can have a second polarity opposite to the first polarity (e.g., negative). The component signals can be combined (e.g., additively combined) based at least in part on their respective polarity to produce the differential signal. For example, a second signal having a negative polarity can be subtracted from a first signal having a positive polarity to produce the differential signal. The combination can be performed in an analog domain, such as by analog combination directly on analog component signals, and/or in a digital domain, such as by digital combination on digital component signals, digital samples of analog component signals, and/or in any other suitable manner. According to example aspects of the present disclosure, a cross-channel differential signal can be produced by taking opposite component signals from a corresponding differential signal of each channel and combining the opposite component signals with regard to polarity and/or phase offsets.

In some embodiments, the component signals and/or differential signals can be sinusoidal signals, such as sine signals and/or cosine signals. For instance, in some embodiments, the first differential signal and the third differential signal each can be a differential sine signal, and the second differential signal and the fourth differential signal each can be a differential cosine signal. For example, in some embodiments, the pairs of component signals can include a sine+ signal, sine− signal, cosine+ signal, cosine− signal, etc. As another example, in some embodiments, the differential signals can be or can include a sine output and/or a cosine output. For example, one or both channels may be configured to produce a sine output and a cosine output. For example, in some embodiments, the pair of component signals may be measured from one or more coils (e.g., receive coils) rotationally disposed about a central axis. A sine output may be measured from a first coil and/or a cosine output may be measured from a second coil rotationally disposed out of phase by an output phase difference, such as a second coil that is 90 degrees out of phase with the first coil. For example, the second coil may be structurally similar and/or identical to the first coil and rotated about the central axis by 90 degrees to produce the cosine output.

The dual channel differential sensor can include a sensing circuit. For example, the sensing circuit can be included as part of and/or separate from the channel circuitry. For example, the sensing circuit can be included in a package (e.g., an integrated circuit, computing device, etc.) that interfaces with the dual channel differential sensor by an interface, such as an interface including one or more signal lines. The signal lines can be pins (e.g., on an integrated circuit), traces, wires, cables, and/or other suitable systems configurable for signal transmission. According to example aspects of the present disclosure, a number of signal lines necessary to interface with the dual channel differential sensor can be reduced while maintaining advantages associated with the dual channel differential sensor.

The sensing circuit can be configured to obtain (e.g., receive and/or sample) the component signals and produce a cross-channel differential signal of the dual channel differential sensor. For instance, the sensing circuit can obtain a first component signal from a first channel and a second component signal from a second channel. The second channel may be independent from the first channel. The first component signal can have a first polarity and/or the second component signal can have a second polarity. The second polarity can be opposing the first polarity. Additionally and/or alternatively, the sensing circuit can obtain a third component signal having the first polarity from the first channel and a fourth component signal having the second polarity from the second channel. For example, the sensing circuit can obtain the signals via an interface including one or more signal lines that are coupled to the dual channel differential sensor (e.g., a sensing circuit, coils, etc.). In some embodiments, each of the obtained component signals can have an associated signal line, such as for a total of four signal lines.

In some embodiments, the component signals described above may each be one of a pair of component signals for differential signals, and signal lines associated with other component signals of each differential signal can be omitted from the sensor (e.g., the interface and/or couplings to the interface) to provide a reduced cabling (e.g., reduction in a number of signal lines) required for the sensing circuit to interface with the dual channel differential sensor (e.g., from eight signal lines to four signal lines). Omitting the other signal lines can additionally and/or alternatively contribute to reduced cost (e.g., reduced operating and/or manufacturing cost), reduced bus width, reduced computation requirements (e.g., require fewer signals to process, fewer signals to sample/measure at the coils, etc.), and/or various other advantages. For instance, in some embodiments, the interface may provide couplings to the omitted signals that may not be connected. In some embodiments, the interface may omit couplings to the omitted signals entirely.

In some embodiments, each of the signals can have an associated phase. For instance, a phase of the first component signal can differ from a phase of the third component signal by a channel phase difference. Additionally and/or alternatively, a phase of the second component signal can differ from a phase of the fourth component signal by the channel phase difference.

In some embodiments, the first component signal and the second component signal each can be sine component signals, such as component signals associated with a differential sine signal. Additionally and/or alternatively, the first cross-channel differential signal can be a sine differential signal (e.g., a sine output). For example, the first cross-channel differential signal can be associated with a sine signal (e.g., wherein a zero value corresponds to a phase of 0 and/or 180 degrees) and can be computed based on component signals of differential sine signals from each channel. Additionally and/or alternatively, the third component signal and the fourth component signal each can be a cosine component signal, such as component signals associated with a differential cosine signal. Additionally and/or alternatively, the second cross-channel differential signal can be a cosine output. For example, the second cross-channel differential signal can be associated with a cosine signal (e.g., wherein a zero value corresponds to a phase of 90 and/or 270 degrees) and can be computed based on component signals of differential cosine signals from each channel.

Additionally and/or alternatively, the sensing circuit can be configured to determine a first cross-channel differential signal based at least in part on the first component signal and the second component signal. For instance, the first component signal and the second component signal can be combined based on respective polarities. For example, the first component signal may have a first polarity (e.g., positive) and the second component signal may have a second polarity (e.g., negative) and the second component signal may be added to and/or subtracted from the first component signal (e.g., subtracted from based on a negative polarity). In some embodiments, the signals may be adjusted to resolve phase differences (e.g., channel phase differences) prior to determining the first cross-channel differential signal.

Additionally and/or alternatively, the sensing circuit can be configured to determine a second cross-channel differential signal based at least in part on the third component signal and the fourth component signal. For instance, the third component signal and the fourth component signal can be combined based on respective polarities. For example, the third component signal may have a first polarity (e.g., positive) and the fourth component signal may have a second polarity (e.g., negative) and the fourth component signal may be added to and/or subtracted from the third component signal (e.g., subtracted based on a negative polarity). In some embodiments, the signals may be adjusted to resolve phase differences (e.g., channel phase differences) prior to determining the second cross-channel differential signal.

The second cross-channel differential signal can be a cosine output of the dual channel differential sensor. The second cross-channel differential signal may correspond to a desired output of the sensor. For example, the sensor may be configured to produce an overall cosine output. For example, in some embodiments, the overall cosine output can be obtained by subtracting a cosine− output of a second channel from a cosine+ output of a first channel. As one example, the second cross-channel differential signal can be computed as $COS_{out}=\text{cosine1+}-\text{cosine2-}$, wherein cosine1+ is a positive cosine component signal from a first channel and cosine2− is a negative cosine component signal from a second channel.

Additionally and/or alternatively, the sensing circuit can be configured to provide the first cross-channel differential signal as a first output of the dual channel differential sensor and/or to provide the second cross-channel differential signal as a second output of the dual channel differential sensor. For example, the sensor may include an external interface configured to be energized by the first cross-channel differential signal and/or the second cross-channel differential signal such that the signals can be provided to an external device capable of reading the signals.

Additionally and/or alternatively, the sensing circuit can implement a safety check to verify desired operation of the sensor and/or system(s) coupled to the sensor (e.g., a motor, gearbox, control system, encoder, etc.). For instance, the sensing circuit can implement the safety check to verify that the sensor is operating correctly and/or operational conditions of the system(s) are safe and/or accurate. Operation of the sensor and/or system(s) can be adjusted based on the safety check. For example, operation of the system can be halted, warnings can be issued, etc. based on the safety check.

For instance, such as to implement the safety check, the sensing circuit can determine a first channel angle based at least in part on the first component signal and the third component signal. For example, the component signals can both be from a same channel (e.g., the first channel) and/or have a same polarity (e.g., positive). For instance, in some embodiments, the signals can include a sine+ signal and a cosine+ signal from a first channel. In some embodiments, the first channel angle can be a two-argument arctangent (e.g., atan2) function. For example, the first channel angle can be determined by atan2(sine+, cosine+).

Additionally and/or alternatively, the sensing circuit can determine a second channel angle based at least in part on the second component signal and the fourth component signal. For example, the signals can both be from a same channel (e.g., the second channel) and/or have a same polarity (e.g., negative). For instance, in some embodiments, the signals can include a sine− signal and a cosine− signal from a second channel. In some embodiments, the second channel angle can be a two-argument arctangent (e.g., atan2) function. For example, the second channel angle can be determined by atan2(sine−, cosine−).

Additionally and/or alternatively, the sensing circuit can determine a cross-channel angle difference based at least in part on the first channel angle and the second channel angle. For example, in some embodiments, the sensing circuit can subtract the second channel angle from the first channel angle to determine the cross-channel angle difference. Additionally and/or alternatively, in some embodiments, the sensing circuit can further determine that the cross-channel angle difference is within a cross-channel correlation tolerance margin. For example, the cross-channel correlation tolerance margin can be or can include a threshold (e.g., a magnitude threshold), a minimum and/or maximum, etc. For instance, in some embodiments, determining that the cross-channel angle difference is within the cross-channel correlation tolerance margin can include determining that a magnitude of the cross-channel angle difference is less than a correlation tolerance threshold, such as a correlation tolerance threshold $\delta$.

In some embodiments, in response to determining that the cross-channel angle difference is within the cross-channel correlation tolerance margin, the sensor can be considered to be under normal operating conditions. For example, measurements can be obtained from the sensor and/or no correction control action related to correcting operation of the sensor may be performed. In some embodiments, in response to determining that the cross-channel angle difference is not within the cross-channel correlation tolerance margin, the sensing circuit can initiate and/or otherwise perform one or more correction control actions to correct operation of the sensor and/or otherwise adjust operation of one or more system(s) coupled to the sensor and/or for which the sensor is configured to monitor conditions. For example, in some cases, in response to determining that the cross-channel angle difference is not within the cross-channel correlation tolerance margin, the correction control action can be or can include a flag, warning, fault resolution action, braking action, shutdown, and/or other suitable correction control actions to ensure safe and reliable operation of a system.

As an example, in one implementation, a dual channel differential sensor can produce a sine differential signal and a cosine differential signal at a first channel including sine1+, sine1−, cosine1+, and cosine1− signals. Additionally and/or alternatively, a second channel can produce sine2+, sine2−, cosine2+, and cosine2− signals. Signal lines can be included that are associated with the sine1+, cosine1+, sine2−, and cosine2− signals. Additionally and/or alternatively, signals lines associated with sine1−, cosine1−, sine2+, and cosine2+ can be omitted from the sensor to provide reduced cabling. Additionally and/or alternatively, measuring points or other circuitry used to measure the signals having omitted signal lines may additionally be omitted, such that the signals with omitted signal lines may not have any dedicated components at the sensor and may exist only as convention. An overall sine output of the sensor can be computed as $SIN_{out}$=sine1+−sine2−. Additionally and/or alternatively, an overall cosine output of the sensor can be computed as $COS_{out}$=cosine1+−cosine2−. If necessary, angular compensations can be included in the computations. Additionally and/or alternatively, an angle between the signals can be computed as atan2($SIN_{out}$, $COS_{out}$). For instance, the angle can be resistant to effects of common mode noise.

These signals can additionally be used to perform a safety check. For instance, a first channel angle between the signals can be computed as angle1+=atan2(sine1+, cosine1+). A second channel angle between the signals can be computed as angle2+=atan2(sine2−, cosine2−). The second channel angle can be subtracted from the first channel angle to produce a cross-channel angle difference by $angle_{diff}$=angle1+−angle2−. The cross-channel angle difference can be checked as being within a cross-channel correlation angle margin (e.g., having a magnitude less than a safety threshold, such as δ). If the cross-channel angle difference is outside of the cross-channel correlation angle margin (e.g., having a magnitude greater than and/or equal to the safety threshold), the sensor may be operating in an unintended capacity, and various safety measures can be performed based on the results of the safety check (e.g., implementing a correction control action).

In practice, such as due to sensor design, manufacturing variations, etc., slight discrepancies may be observed between the channels, such as between the first component signal and the third component signal and/or the second component signal and the fourth component signal without departing from example aspects of the present disclosure. For example, such as due to limited space on a circuit board or other substrate, coils generating the first component signal and the third component signal may be offset, such as rotationally offset, such that a known channel phase difference is introduced between the first component signal and the third component signal. Similarly, coils generating the second component signal and the fourth component signal may be offset, such as rotationally offset, such that a known channel phase difference (e.g., the same channel phase difference as between the first and third component signals) is introduced between the second component signal and the fourth component signal. As one example, the dual channel component sensor may be implemented using two channels of sinusoidal coils that are coaxially positioned. Because of interference between the coils, spatial limitations, etc., the coils associated with each channel may be offset by a known phase difference, such as about 45 degrees. In some embodiments, the sensor can be designed (e.g., using a multi-layer PCB) such that no channel phase difference exists, and/or may be designed to at least partially compensate for a channel phase difference (e.g., having a channel phase difference of less than about 45 degrees, such as less than about 15 degrees)

Additionally and/or alternatively, variations such as manufacturing variations, supply differences, noise, etc. may introduce minor amplitude differences between the channels, such that the first channel may have a first amplitude (e.g., common to the first and second differential signals) and the second channel may have a second amplitude (e.g., common to the third and fourth differential signals). For example, performance (e.g., gains) of circuitry (e.g., an application-specific integrated circuit (ASIC)) associated with the first channel may differ slightly from performance of circuitry (e.g., an ASIC) associated with the second channel due to manufacturing variations, supply differences, noise, etc., which may contribute to amplitude variations. As another example, tuning algorithms, such as automatic gain stabilization algorithms, may converge to different solutions from circuitry to circuitry. Thus, the first amplitude and second amplitude may desirably be identical, in some embodiments, but may nonetheless experience a slight (e.g., less than about 10%) variation in practice.

Thus, in some embodiments, a channel phase compensation can be applied to measurements from the sensor. For instance, the channel phase compensation can be applied to the output angle to correct for phase discrepancies between the first channel and the second channel. For instance, in some embodiments, determining an output angle between the first cross-channel differential signal and the second cross-channel differential signal can include applying a channel phase correction to the output angle.

The channel phase correction can be based at least in part on the channel phase difference. For instance, in some embodiments, the channel phase correction can be applied to correct the channel phase difference. Additionally and/or alternatively, in some embodiments, the channel phase correction can be based at least in part on an amplitude of the first channel and an amplitude of the second channel. For instance, in some embodiments, minor variations between the first and second channel can contribute to minor differences in amplitudes of each channel.

For instance, in some embodiments, determining an output angle between the first cross-channel differential signal and the second cross-channel differential signal can include determining an amplitude of the first channel and determining an amplitude of the second channel. For example, amplitudes of the channels can be determined by measuring amplitude (e.g., maximum amplitude) of the channels over one or more cycles (e.g., complete periods) of the component signals. For example, the amplitude of a channel may correspond to an amplitude of a component signal (e.g., one of the pairs of component signals) and/or a differential signal (e.g. after combining the pair of component signals) and/or any other suitable signals (e.g., intermediate signals) associated with the channel.

Additionally and/or alternatively, in some embodiments, determining the output angle can include determining the channel phase correction based at least in part on the amplitude of the first channel, the amplitude of the second channel, and the phase difference. For example, in some embodiments, determining the angular offset can be based on the formula:

$$\Delta\theta = (\varphi/2) \cdot ((A-B)/(A+B))$$

where $\Delta\theta$ is the channel phase correction, $\varphi$ is the channel (e.g., physical) phase difference, A is the amplitude of the first channel, and B is the amplitude of the second channel.

Additionally and/or alternatively, in some embodiments, determining the output angle can include applying the channel phase correction to the output angle. For example, the channel phase correction can be combined with (e.g., additively combined with) the output angle, such as added to and/or subtracted from the output angle.

Example aspects of the present disclosure can provide for a number of technical effects and benefits. For instance, according to example aspects of the present disclosure, a dual channel differential sensor can be configured to experience reduced cabling while maintaining advantages of the dual channel differential sensor, including safety, reliability, and noise tolerance. For example, obtaining signals from the sensor as described herein (e.g., a sine+ signal and cosine+ signal from a first channel and a sine− signal and cosine− signal from a second channel) can require only half a number of signal lines compared to obtaining four complete differential signals. Additionally and/or alternatively, obtaining sensor measurements as described herein can provide low noise measurements having robustness to noise, such as common mode noise, while achieving the reduction in signal lines. For instance, the signals as described herein can maintain differential characteristics (e.g., between signals of opposite polarities) that provide resistance to effects of common mode noise. Additionally and/or alternatively, the use of signals from two channels can provide improved safety and reliability while achieving the reduction in signal lines. For example, the use of signals from two channels can provide for safety checks between the signals from two channels, which can be robust to operational variations.

Referring now to the FIGS., example aspects of the present disclosure will be discussed in greater detail with respect to example implementations of the present disclosure.

FIG. 1A depicts a block diagram of at least a portion of an example dual channel differential sensor 100 according to example embodiments of the present disclosure. The differential sensor 100 can include first channel 110 and/or second channel 130. First channel 110 can include first channel circuitry 112. First channel circuitry 112 can be configured to process signals related to sensor measurements and produce first differential signal 120 and/or second differential signal 125.

First differential signal 120 can include first component signal 122 and second component signal 124. In some embodiments, first differential signal 120 can be or can include a differential sinusoidal output. For example, first component signal 122 can be a sinusoidal signal and second component signal 124 can be a sinusoidal signal having opposite polarity from first component signal 122. For example, in some embodiments, first component signal 122 and second component signal 124 can be 180 degrees out of phase. As one example, first component signal 122 can be a sine+ signal and second component signal 124 can be a sine− signal.

Additionally and/or alternatively, in some embodiments, second differential signal 125 can be or can include a differential sinusoidal output. For instance, second differential signal 125 can include first component signal 126 and second component signal 128. For example, first component signal 126 can be a sinusoidal signal and second component signal 128 can be a sinusoidal signal having opposite polarity from first component signal 126. For example, in some embodiments, first component signal 126 and second component signal 128 can be 180 degrees out of phase. Additionally and/or alternatively, first component signals 122 and 126 and/or second component signals 124 and 128 can have a known phase difference, such as an output phase difference. As one example, second differential signal 125 can be configured as a cosine output. As one example, first component signal 126 can be a cosine+ signal and second component signal 128 can be a cosine− signal. The cosine signals of second differential signal 125 can thus have a 90 degrees phase difference with the sine signals of first differential signal 120. For example, many systems can operate with regard to sine and cosine measurements from a sensor, such as an inductive rotation sensor.

Additionally and/or alternatively, in some embodiments, first channel 110 can include receive coils 114 and/or transmit coils 116. For instance, first channel circuitry 112 can be configured to energize transmit coils 116. The energized transmit coils 116 can produce an electromagnetic field that interacts with target 105. The electromagnetic field can further interact with receive coils 114, and/or may be affected by target 105. For instance, the electromagnetic field can induce receive signals (e.g., inductive currents) in the receive coils 114. The first channel circuitry 112 can measure, sample, and/or process the receive signals to produce the differential signals 120, 125. As one example, transmit coils 116 and receive coils 114 are discussed with reference to FIG. 3. Other suitable arrangements of coils 114, 116 and/or other suitable sensor arrangements (e.g., magnetic encoders) can be employed in accordance with example aspects of the present disclosure.

Additionally and/or alternatively, differential sensor 100 can include second channel 130. Second channel 130 can include second channel circuitry 132. Second channel circuitry 132 can be configured to process signals related to sensor measurements and produce third differential signal 140 and/or fourth differential signal 145.

Third differential signal 140 can include first component signal 142 and second component signal 144. In some embodiments, third differential signal 140 can be or can include a differential sinusoidal output. For example, first component signal 142 can be a sinusoidal signal and second component signal 144 can be a sinusoidal signal having opposite polarity from first component signal 142. For example, in some embodiments, first component signal 142 and second component signal 144 can be 180 degrees out of phase. As one example, first component signal 142 can be a sine+ signal and second component signal 144 can be a sine− signal.

Additionally and/or alternatively, in some embodiments, fourth differential signal 145 can be or can include a differential sinusoidal output. For instance, fourth differential signal 145 can include first component signal 146 and second component signal 148. For example, first component signal 146 can be a sinusoidal signal and second component signal 148 can be a sinusoidal signal having opposite polarity from first component signal 146. For example, in some embodiments, first component signal 146 and second component signal 148 can be 180 degrees out of phase. Additionally and/or alternatively, first component signals 142 and 146 and/or second component signals 144 and 148 can have a known phase difference, such as an output phase difference. As one example, fourth differential signal 145 can be configured as a cosine output. As one example, first component signal 146 can be a cosine+ signal and second component signal 148 can be a cosine− signal. The cosine signals of fourth differential signal 145 can thus have a 90 degrees phase difference with the sine signals of third differential signal 140. For example, many systems can operate with regard to sine and cosine measurements from a sensor, such as an inductive rotation sensor.

First differential signal 120 and third differential signal 140 can be correlated, such that first differential signal 120 corresponds to third differential signal 140. For instance, the third differential signal 140 may convey identical, redundant, or otherwise corroborating information to the first differential signal 120. For example, in some embodiments, the pair of component signals 122, 124 can be nearly equivalent to and/or equivalent to the pair of component signals 142, 144 (e.g., a phase-shifted pair of component signals 142, 144).

Additionally and/or alternatively, second differential signal 125 and fourth differential signal 145 can be correlated, such that second differential signal 125 corresponds to fourth differential signal 145. For instance, the fourth differential signal 145 may convey identical, redundant, or otherwise corroborating information to the second differential signal 125. For example, in some embodiments, the pair of component signals 126, 128 can be nearly equivalent to and/or equivalent to the pair of component signals 146, 148 (e.g., a phase-shifted pair of component signals 146, 148).

The first channel 110 and/or second channel 130 can be coupled to a sensing circuit 150. For example, a sensing circuit 150 can be configured to obtain component signals 122, 126, 144, 148 as illustrated in FIG. 1A. Other suitable signals of any of the differential signals 120, 125, 140, 145 in accordance with example aspects of the present disclosure. The sensing circuit 150 can be configured to process measurements from the sensor 100. For example, the sensing circuit 150 can obtain cross-channel differential signals and/or perform safety checks. The sensing circuit 150 may be separate from sensor 100 and/or incorporated into sensor 100.

For instance, in some embodiments, a sensing circuit 150 can be or can include a microcontroller and/or other suitable circuitry. In some embodiments, the sensing circuit can be configured to sample (e.g., digitally sample) the component signals 122, 126, 144, 148 and/or perform angle calculations for the output. In these embodiments, and/or if an angle and phase difference between the channels is near or exactly zero, the angles can be averaged to remove noise. As another example, the sensor 100 can include a differential input stage (e.g., in a sensing circuit 150) such that measurements can be directly obtained of the analog signals and/or calculations can be performed directly on the analog signals. For instance, the differential input stage can perform analog computations to directly compute values of the cross-channel differential signals. This can provide improved noise removal characteristics.

Figure 1B:
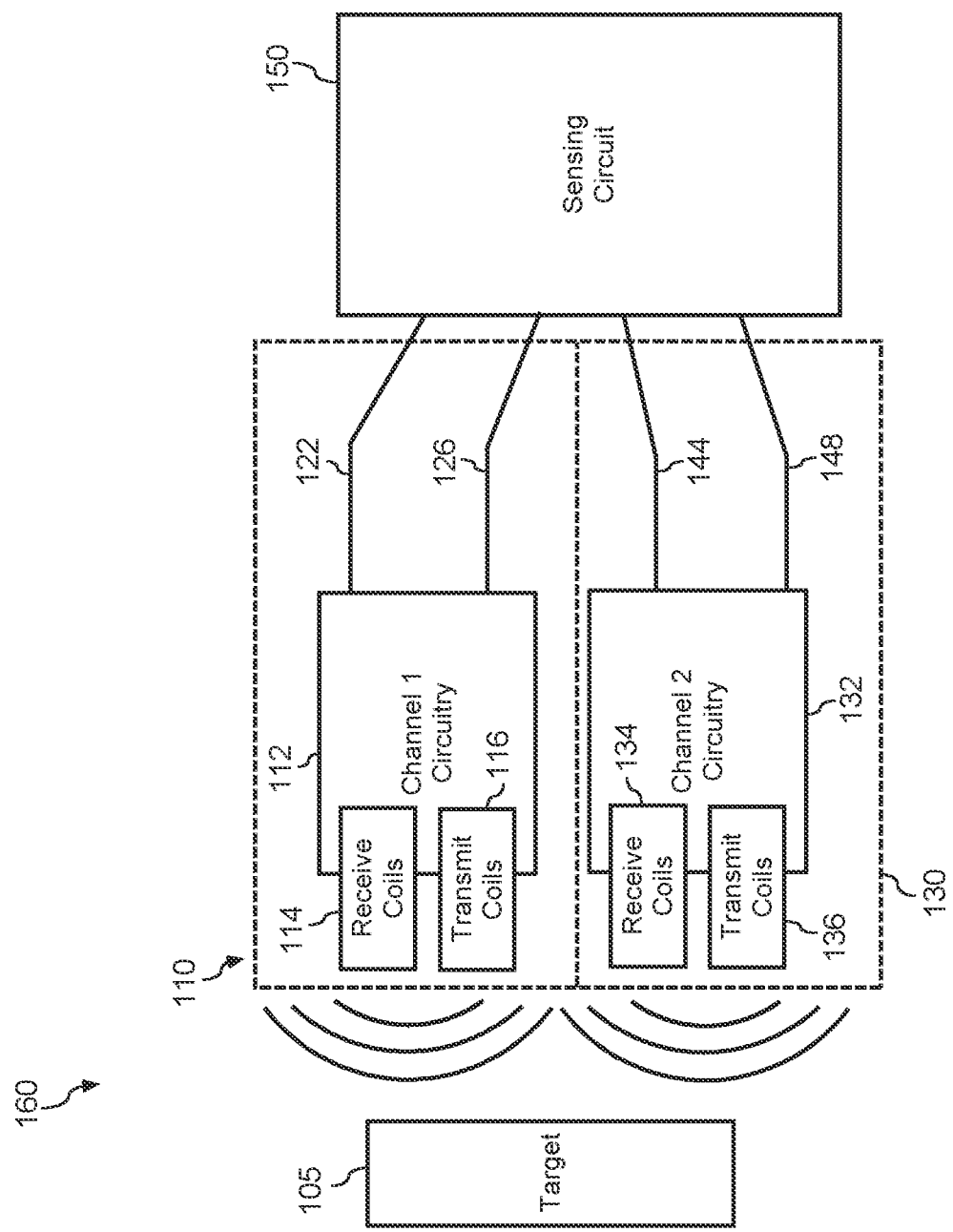
FIG. 1B depicts a block diagram of at least a portion of an example dual channel differential sensor according to example embodiments of the present disclosure.

FIG. 1B depicts a block diagram of at least a portion of an example dual channel differential sensor 160 according to example embodiments of the present disclosure. The sensor 160 is similar to the sensor 100 of FIG. 1A, but signal lines associated with omitted signals (e.g., signal lines 124, 128, 142, 146 of FIG. 1A) are omitted from the sensor. Thus, while FIG. 1A depicts an embodiment where the omitted signals exist (e.g., are produced by channel circuitry 112, 132) and are simply not connected, FIG. 1B depicts an embodiment where the omitted signals are removed from the sensor entirely, and only four component signals are produced by the channel circuitry 112, 132. Both configurations depicted in FIG. 1A and FIG. 1B, in addition to and/or alternatively to any other suitable variations, may be employed in accordance with example aspects of the present disclosure.

Figure 2:
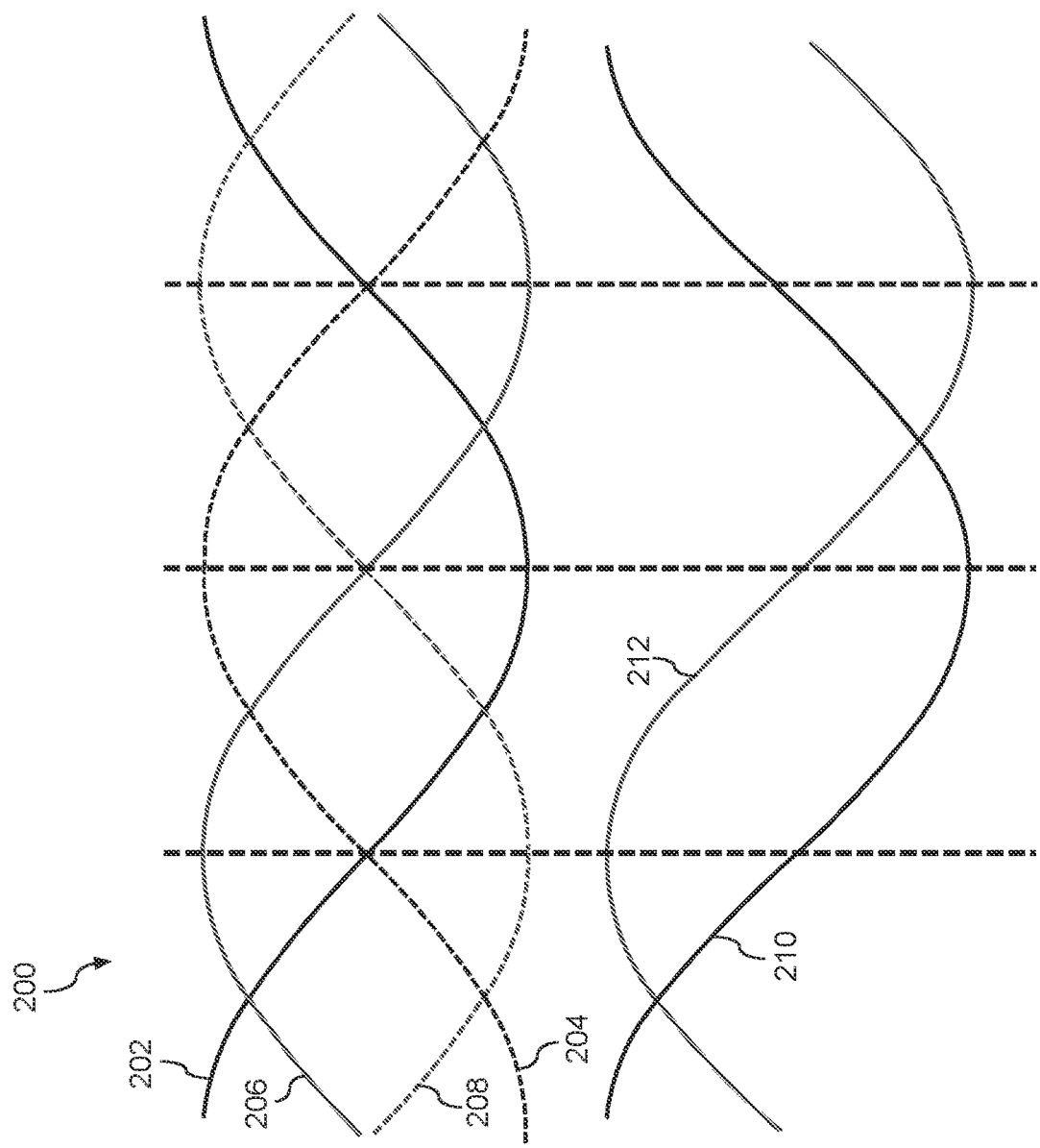
FIG. 2 depicts plots of example component signals forming an example differential signal from an example channel according to example embodiments of the present disclosure.

FIG. 2 depicts plots 200 of example component signals forming an example differential signal from an example channel according to example embodiments of the present disclosure. For example, component signals 202 and 204 are associated with first differential signal 210. For instance, first component signal 202 can have a first polarity (e.g., positive) and second component signal 204 can have a second polarity (e.g., negative). Second component signal 204 can be subtracted from first component signal 202 to produce first differential signal 210. For instance, first differential signal 210 can be a sine output. Additionally and/or alternatively, component signals 206 and 208 are associated with second differential signal 212. For instance, first component signal 202 can have a first polarity (e.g., positive) and second component signal 204 can have a second polarity (e.g., negative). Second component signal 204 can be subtracted from first component signal 202 to produce second differential signal 212. For instance, second differential signal 212 can be a cosine output.

Figure 3:
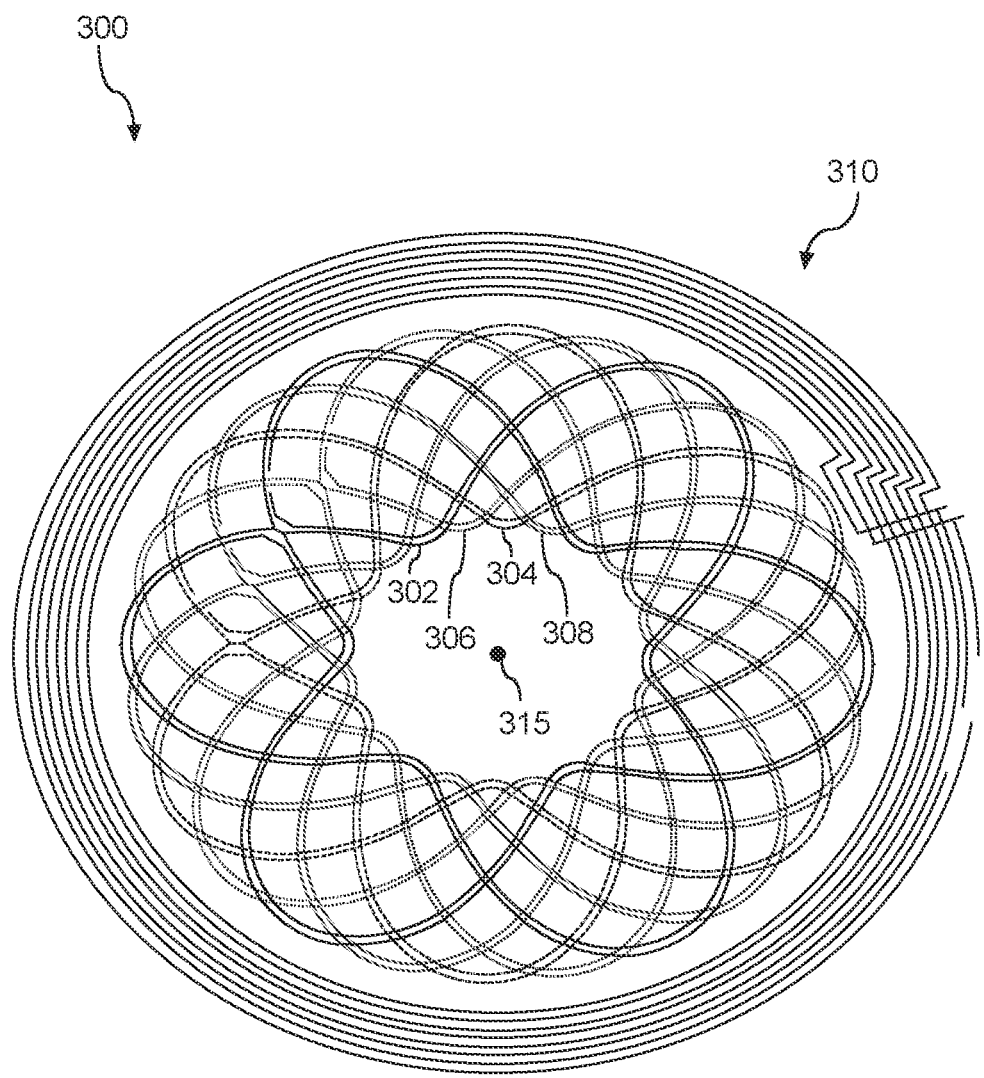
FIG. 3 depicts example sensor coils according to example embodiments of the present disclosure.

FIG. 3 depicts example sensor coils 300 according to example embodiments of the present disclosure. For instance, the coils 300 can be disposed on a substrate, such as formed of traces on a printed circuit board (PCB), flexible printed circuit board, and/or other suitable substrate. For example, in some embodiments, the coils 300 are formed on a multi-layer substrate, such as a two-layer PCB. For example, each layer of a multi-layer substrate can include one or more of the coils 300. Additionally and/or alternatively, the coils 300 can be cut from metal sheets, formed of wound or bent wire or other conductive filament, and/or formed in any suitable fashion in accordance with example aspects of the present disclosure. The coils 300, such as the transmit coils 310 and/or the receive coils 302-308, can be disposed around a central axis 315. In some embodiments, the receive coils 302-308 may be configured to produce a pair of component signals. For instance, the receive coils 302-308 may each be measured at two points to produce the pair of component signals, only one of which may be utilized at a sensing circuit, in accordance with example aspects of the present disclosure. Additionally and/or alternatively, the receive coils 302-308 may be measured at only a single point.

The coils 300 can include transmit coils 310. The transmit coils 310 can be energized (e.g., by channel circuitry) to produce an electromagnetic field. For example, the transmit coils can be energized by any suitable electrical signal, such as a voltage signal, current signal, etc., and/or a constant signal and/or time-varying signal. The electromagnetic field produced by the transmit coils can interact with an environment of a sensor, such as a target, and may be altered by elements in the environment, such as the target. For example, a target can be configured to produce fringing fields that attenuate and/or boost the electromagnetic field at particular regions. As one example, a target can include a rotational target that rotates (e.g., coaxially with central axis 315) to alter the electromagnetic field as a function of rotational position of the target.

Additionally and/or alternatively, the coils 300 can include receive coils 302, 304, 306, and 308. First receive coil 302 can be configured to produce a first differential signal. For instance, a receive signal (e.g., an inductive current) can be induced in first receive coil 302 by an electromagnetic field, such as an electromagnetic field from transmit coils 310, induced by a target, present in 87an environment of the coils, and/or from any other suitable source. Channel circuitry can sample and/or measure the first receive coil 302 to produce a pair of component signals associated with a first differential signal from the first receive coil 302. Similarly, second receive coil 304 can be configured to produce a second differential signal. For example, channel circuitry (e.g., associated with a same channel as first receive coil 302) can sample and/or measure the second receive coil 304 to produce a pair of component signals associated with a second differential signal from the second receive coil 304. For instance, the first receive coil 302 and second receive coil 304 can form a single channel. As illustrated in FIG. 3, the first receive coil 302 and second receive coil 304 are sinusoidal coils configured to produce a sinusoidal differential signal. Additionally and/or alternatively, as illustrated in FIG. 3, the second receive coil 304 is rotationally offset by 90 degrees with respect to the first receive coil 302. Thus, the first receive coil 302 can be configured to produce a sine output and the second receive coil 304 can be configured to produce a cosine output.

Similarly, third receive coil 306 can be configured to produce a third differential signal and fourth receive coil 308 can be configured to produce a fourth differential signal. For instance, third receive coil 306 and/or fourth receive coil 308 can be sampled and/or measured by channel circuitry associated with a different channel from first receive coil 302 and/or second receive coil 304. For instance, in some embodiments, first receive coil 302 and/or second receive coil 304 can be disposed on a first layer of a multi-layer substrate and third receive coil 306 and/or fourth receive coil 308 can be disposed on a second layer of the multi-layer substrate. As illustrated in FIG. 3, third receive coil 306 and/or fourth receive coil 308 are rotationally offset about central axis 315 by a channel phase offset of 45 degrees with respect to the first receive coil 302 and/or second receive coil 304. For instance, this channel phase offset can be implemented due to spatial limitations of a substrate containing the coils 300, interference considerations between the coils 300, etc. In some embodiments, the coils 300 may instead have a channel phase offset of less than about 45 degrees, such as less than about 15 degrees. As another example, in some embodiments, the coils 300 may have a channel phase offset of 0 degrees.

Figure 4:
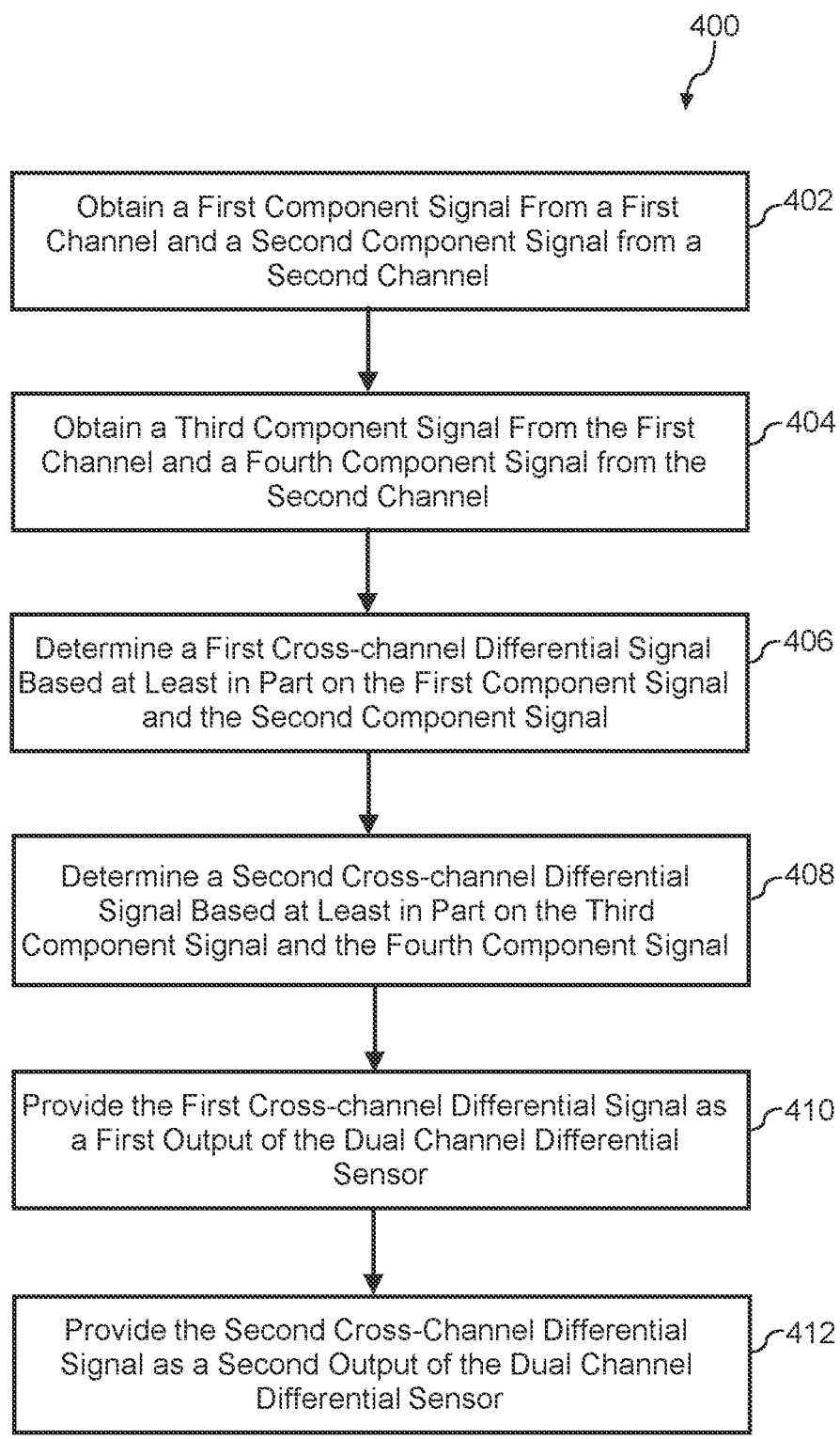
FIG. 4 depicts a flowchart diagram of an example method for operating a dual channel differential sensor according to example embodiments of the present disclosure.

FIG. 4 depicts a flowchart diagram of an example method 400 for operating a dual channel differential sensor according to example embodiments of the present disclosure. Although FIG. 4 depicts steps performed in a particular order for purposes of illustration and discussion, the methods of the present disclosure are not limited to the particularly illustrated order or arrangement. The various steps of the method 400 can be omitted, rearranged, combined, and/or adapted in various ways without deviating from the scope of the present disclosure.

For instance, the method 400 can include, at 402, obtaining a first component signal from a first channel and a second component signal from a second channel. The second channel may be independent from the first channel. The first component signal can have a first polarity and/or the second component signal can have a second polarity. The second polarity can be opposing the first polarity. Additionally and/or alternatively, the method 400 can include, at 404, obtaining a third component signal having the first polarity from the first channel and a fourth component signal having the second polarity from the second channel. For example, a sensing circuit can obtain the signals via an interface including one or more signal lines that are coupled to the dual channel differential sensor (e.g., a sensing circuit, coils, etc.). In some embodiments, each of the obtained component signals can have an associated signal line, such as for a total of four signal lines.

In some embodiments, the component signals described above may each be one of a pair of component signals for differential signals, and signal lines associated with other component signals of each differential signal can be omitted from the sensor (e.g., the interface and/or couplings to the interface) to provide a reduced cabling (e.g., reduction in a number of signal lines) required for a sensing circuit to interface with the dual channel differential sensor (e.g., from eight signal lines to four signal lines). Omitting the other signal lines can additionally and/or alternatively contribute to reduced cost (e.g., reduced operating and/or manufacturing cost), reduced bus width, reduced computation requirements (e.g., require fewer signals to process, fewer signals to sample/measure at the coils, etc.), and/or various other advantages. For instance, in some embodiments, the interface may provide couplings to the omitted signals that may not be connected. In some embodiments, the interface may omit couplings to the omitted signals entirely.

In some embodiments, each of the signals can have an associated phase. For instance, a phase of the first component signal can differ from a phase of the third component signal by a channel phase difference. Additionally and/or alternatively, a phase of the second component signal can differ from a phase of the fourth component signal by the channel phase difference.

In some embodiments, the first component signal and the second component signal each can be sine component signals, such as component signals associated with a differential sine signal. Additionally and/or alternatively, the first cross-channel differential signal can be a sine differential signal (e.g., a sine output). For example, the first cross-channel differential signal can be associated with a sine signal (e.g., wherein a zero value corresponds to a phase of θ and/or 180 degrees) and can be computed based on component signals of differential sine signals from each channel. Additionally and/or alternatively, the third component signal and the fourth component signal each can be a cosine component signal, such as component signals associated with a differential cosine signal. Additionally and/or alternatively, the second cross-channel differential signal can be a cosine output. For example, the second cross-channel differential signal can be associated with a cosine signal (e.g., wherein a zero value corresponds to a phase of 90 and/or 270 degrees) and can be computed based on component signals of differential cosine signals from each channel.

Additionally and/or alternatively, the method 400 can include, at 406, determining a first cross-channel differential signal based at least in part on the first component signal and the second component signal. For instance, the first component signal and the second component signal can be combined based on respective polarities. For example, the first component signal may have a first polarity (e.g., positive) and the second component signal may have a second polarity (e.g., negative) and the second component signal may be added to and/or subtracted from the first component signal (e.g., subtracted from based on a negative polarity). In some embodiments, the signals may be adjusted to resolve phase differences (e.g., channel phase differences) prior to determining the first cross-channel differential signal.

Additionally and/or alternatively, the method 400 can include, at 408, determining a second cross-channel differential signal based at least in part on the third component signal and the fourth component signal. For instance, the third component signal and the fourth component signal can be combined based on respective polarities. For example, the third component signal may have a first polarity (e.g., positive) and the fourth component signal may have a second polarity (e.g., negative) and the fourth component signal may be added to and/or subtracted from the third component signal (e.g., subtracted based on a negative polarity). In some embodiments, the signals may be adjusted to resolve phase differences (e.g., channel phase differences) prior to determining the second cross-channel differential signal.

The second cross-channel differential signal can be a cosine output of the dual channel differential sensor. The second cross-channel differential signal may correspond to a desired output of the sensor. For example, the sensor may be configured to produce an overall cosine output. For example, in some embodiments, the overall cosine output can be obtained by subtracting a cosine− output of a second channel from a cosine+ output of a first channel. As one example, the second cross-channel differential signal can be computed as $COS_{out}$=cosine1+−cosine2−, wherein cosine1+ is a positive cosine component signal from a first channel and cosine2− is a negative cosine component signal from a second channel.

Additionally and/or alternatively, the method 400 can include, at 410, providing the first cross-channel differential signal as a first output of the dual channel differential sensor. Additionally and/or alternatively, the method 400 can include, at 412, providing the second cross-channel differential signal as a second output of the dual channel differential sensor. For example, the sensor may include an external interface configured to be energized by the first cross-channel differential signal and/or the second cross-channel differential signal such that the signals can be provided to an external device capable of reading the signals.

In some embodiments, a channel phase compensation can be applied to measurements from the sensor. For instance, the channel phase compensation can be applied to the output angle to correct for phase discrepancies between the first channel and the second channel. For instance, in some embodiments, determining an output angle between the first cross-channel differential signal and the second cross-channel differential signal can include applying a channel phase correction to the output angle.

The channel phase correction can be based at least in part on the channel phase difference. For instance, in some embodiments, the channel phase correction can be applied to correct the channel phase difference. Additionally and/or alternatively, in some embodiments, the channel phase correction can be based at least in part on an amplitude of the first channel and an amplitude of the second channel. For instance, in some embodiments, minor variations between the first and second channel can contribute to minor differences in amplitudes of each channel.

For instance, in some embodiments, determining an output angle between the first cross-channel differential signal and the second cross-channel differential signal can include determining an amplitude of the first channel and determining an amplitude of the second channel. For example, amplitudes of the channels can be determined by measuring amplitude (e.g., maximum amplitude) of the channels over one or more cycles (e.g., complete periods) of the component signals. For example, the amplitude of a channel may correspond to an amplitude of a component signal (e.g., one of the pairs of component signals) and/or a differential signal (e.g. after combining the pair of component signals) and/or any other suitable signals (e.g., intermediate signals) associated with the channel.

Additionally and/or alternatively, in some embodiments, determining the output angle can include determining the channel phase correction based at least in part on the amplitude of the first channel, the amplitude of the second channel, and the phase difference. For example, in some embodiments, determining the angular offset can be based on the formula:

$$\Delta\theta=(\varphi/2)\cdot((A-B)/(A+B))$$

where $\Delta\theta$ is the channel phase correction, $\varphi$ is the channel phase difference, A is the amplitude of the first channel, and B is the amplitude of the second channel.

Additionally and/or alternatively, in some embodiments, determining the output angle can include applying the channel phase correction to the output angle. For example, the channel phase correction can be combined with (e.g., additively combined with) the output angle, such as added to and/or subtracted from the output angle.

Figure 5:
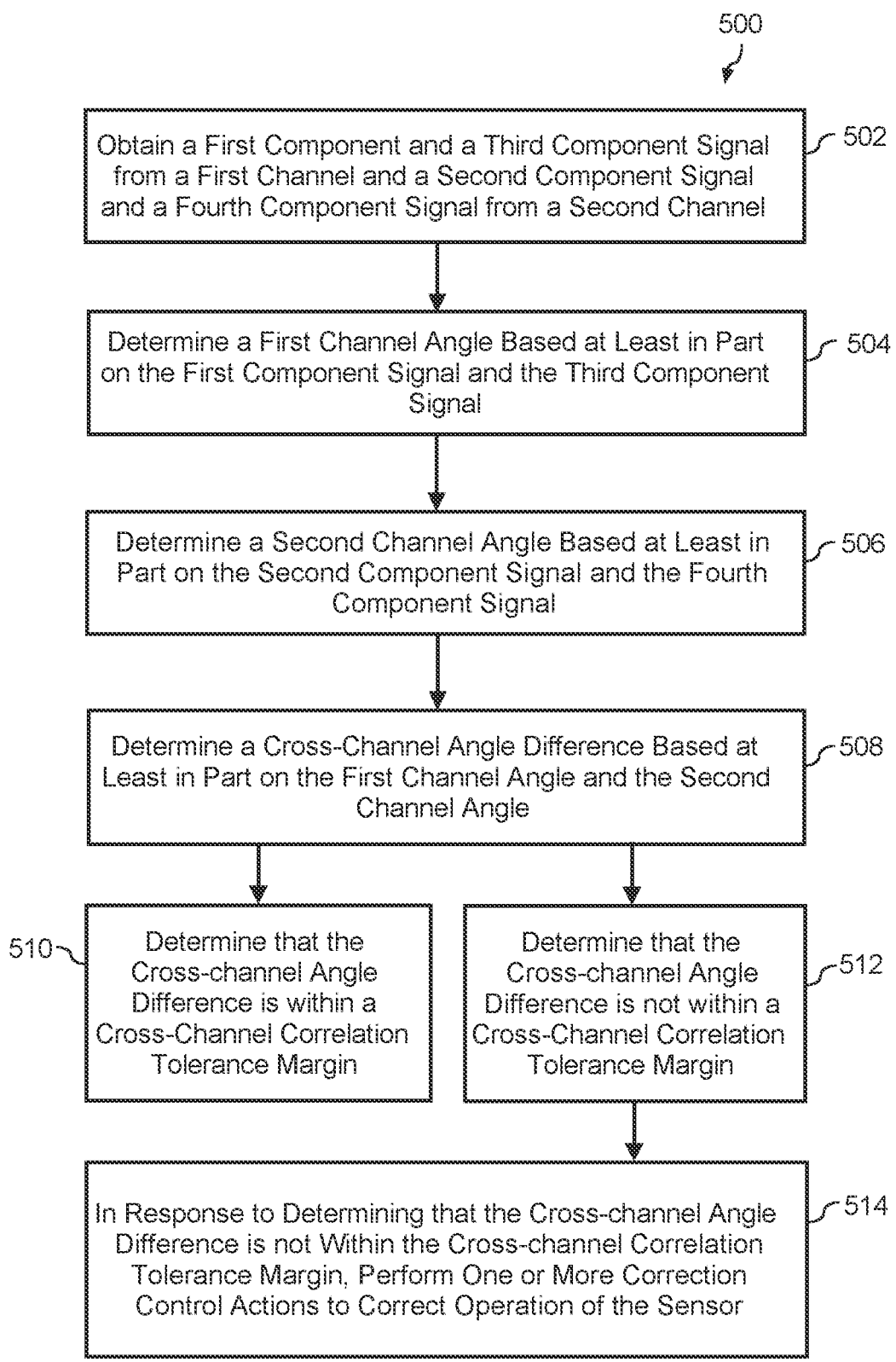
FIG. 5 depicts a flowchart diagram of an example method for operating a dual channel differential sensor according to example embodiments of the present disclosure.

FIG. 5 depicts a flowchart diagram of an example method 500 for operating a dual channel differential sensor according to example embodiments of the present disclosure. Although FIG. 5 depicts steps performed in a particular order for purposes of illustration and discussion, the methods of the present disclosure are not limited to the particularly illustrated order or arrangement. The various steps of the method 500 can be omitted, rearranged, combined, and/or adapted in various ways without deviating from the scope of the present disclosure.

For instance, a sensor (e.g., a sensing circuit) can implement steps of method 500 as safety check to verify desired operation of the sensor and/or system(s) coupled to the sensor (e.g., a motor, gearbox, control system, encoder, etc.). For instance, a sensing circuit can implement the method 500 (e.g., the safety check) to verify that the sensor is operating correctly and/or operational conditions of the system(s) are safe and/or accurate. Operation of the sensor and/or system(s) can be adjusted based on the safety check. For example, operation of the system can be halted, warnings can be issued, etc. based on the safety check.

The method 500 can include, at 502, obtaining a first component signal and a third component signal from a first channel and a second component signal and a fourth component signal from a second channel. The second channel may be independent from the first channel. The first component signal can have a first polarity and/or the second component signal can have a second polarity. The second polarity can be opposing the first polarity. The third component signal can have the first polarity. The fourth component signal can have the second polarity. For example, a sensing circuit can obtain the signals via an interface including one or more signal lines that are coupled to the dual channel differential sensor (e.g., a sensing circuit, coils, etc.). In some embodiments, each of the obtained component signals can have an associated signal line, such as for a total of four signal lines.

The method 500 can include, at 504, determining a first channel angle based at least in part on the first component signal and the third component signal. For example, the component signals can both be from a same channel (e.g., the first channel) and/or have a same polarity (e.g., positive). For instance, in some embodiments, the signals can include a sine+ signal and a cosine+ signal from a first channel. In some embodiments, the first channel angle can be a two-argument arctangent (e.g., atan2) function. For example, the first channel angle can be determined by atan2(sine+, cosine+).

Additionally and/or alternatively, the method 500 can include, at 506, determining a second channel angle based at least in part on the second component signal and the fourth component signal. For example, the signals can both be from a same channel (e.g., the second channel) and/or have a same polarity (e.g., negative). For instance, in some embodiments, the signals can include a sine− signal and a cosine− signal from a second channel. In some embodiments, the second channel angle can be a two-argument arctangent (e.g., atan2) function. For example, the second channel angle can be determined by atan2(sine−, cosine−).

Additionally and/or alternatively, the method 500 can include, at 508, determining a cross-channel angle difference based at least in part on the first channel angle and the second channel angle. For example, in some embodiments, the sensing circuit can subtract the second channel angle from the first channel angle to determine the cross-channel angle difference. Additionally and/or alternatively, in some embodiments, the method 500 can further include, at 510, determining that the cross-channel angle difference is within a cross-channel correlation tolerance margin. For example, the cross-channel correlation tolerance margin can be or can include a threshold (e.g., a magnitude threshold), a minimum and/or maximum, etc. For instance, in some embodiments, determining that the cross-channel angle difference is within the cross-channel correlation tolerance margin can include determining that a magnitude of the cross-channel angle difference is less than a correlation tolerance threshold, such as a correlation tolerance threshold S.

In some embodiments, in response to determining that the cross-channel angle difference is within the cross-channel correlation tolerance margin, the sensor can be considered to be under normal operating conditions. For example, measurements can be obtained from the sensor and/or no correction control action related to correcting operation of the sensor may be performed. Additionally and/or alternatively, the method 500 can include, at 512, determining that the cross-channel angle difference is not within the cross-channel correlation tolerance margin. The method 500 can further include, at 514, in response to determining that the cross-channel angle difference is not within the cross-channel correlation tolerance margin, performing one or more correction control actions to correct operation of the sensor and/or otherwise adjust operation of one or more system(s) coupled to the sensor and/or for which the sensor is configured to monitor conditions. For example, in some cases, in response to determining that the cross-channel angle difference is not within the cross-channel correlation tolerance margin, the correction control action can be or can include a warning, fault resolution action, braking action, shutdown, and/or other suitable correction control actions to ensure safe and reliable operation of a system.

For instance, one example embodiment of the present disclosure can include a dual channel differential sensor. The dual channel differential sensor can include a first channel including one or more first receive coils configured to produce one or more first coil signatures in response to interaction with a target, a first channel circuit configured to produce a first sine component signal and a first cosine component signal in response to the one or more first coil signatures, the first sine component signal and first cosine component signal having a first polarity, and a first interface configured to provide the first sine component signal and the first cosine component signal. Additionally, the dual channel differential sensor can include a second channel that includes one or more second receive coils configured to produce one or more second coil signatures in response to interaction with the target, a second channel circuit independent from the first channel circuit, the second channel circuit configured to produce a second sine component signal and a second cosine component signal in response to the one or more second coil signatures, the second sine component signal and second cosine component signal having a second polarity opposing the first polarity, and a second interface configured to provide the second sine component signal and the second cosine component signal. Additionally, the dual channel differential sensor can include a sensing circuit that is configured to obtain the first sine component signal, the first cosine component signal, the second sine component signal, and the second cosine component signal, determine a cross-channel sine differential signal based at least in part on the first sine component signal and the second sine component signal and a cross-channel cosine differential signal based at least in part on the first cosine component signal and the second cosine component signal, determine an output angle based at least in part on a two-argument arctangent of the cross-channel sine differential signal and the cross-channel cosine differential signal, and provide the cross-channel sine differential signal, cross-channel cosine differential signal, and output angle as outputs of the dual channel differential sensor.

As used herein, "about" in conjunction with a stated numerical value is intended to refer to within 20% of the stated numerical value.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A dual channel differential sensor comprising:
 a first channel, the first channel configured to produce a first component signal, the first channel is configured to produce a third component signal, the third component signal having the first polarity;
 a second channel that is independent from the first channel, the second channel configured to produce a second component signal the second channel is configured to produce a fourth component signal, the fourth component signal having the second polarity;
 a sensing circuit configured to:
  obtain the first component signal and the second component signal, the first component signal having a first polarity and the second component signal having a second polarity, the second polarity opposing the first polarity;
determine a first cross-channel differential signal based at least in part on the first component signal and the second component signal;
provide the first cross-channel differential signal as a first output of the dual channel differential sensor;
obtain the third component signal and the fourth component signal;
determine a second cross-channel differential signal based at least in part on the third component signal and the fourth component signal; and
provide the second cross-channel differential signal as a second output of the dual channel differential sensor.

2. The dual channel differential sensor of claim 1, wherein the dual channel differential sensor comprises one or more of an inductive sensor, an inductive motor sensor, an inductive gearbox sensor, an inductive position sensor, a magnetic encoder, an electronic brake booster, an electronic brake system, a steering system, or a torque control system.

3. The dual channel differential sensor of claim 1, wherein the first component signal and the second component signal are sinusoidal signals, and wherein the third component signal and the fourth component signals are sinusoidal signals that are phase shifted relative to the first component signal and the second component signal.

4. The dual channel differential sensor of claim 1, wherein the sensing circuit is further configured to determine an output angle based at least in part on the first cross-channel differential signal and the second cross-channel differential signal.

5. The dual channel differential sensor of claim 4, wherein the output angle is based at least in part on a two-argument arctangent of the first cross-channel differential signal and the second cross-channel differential signal.

6. The dual channel differential sensor of claim 4, wherein a phase of the first channel is offset from a phase of the second channel by a channel phase difference, and wherein determining the output angle comprises:
determining an amplitude of the first channel;
determining an amplitude of the second channel; and
determining a channel phase correction based at least in part on the amplitude of the first channel, the amplitude of the second channel, and the channel phase difference;
applying the channel phase correction to the output angle.

7. The dual channel differential sensor of claim 6, wherein determining the channel phase correction is based at least in part on a formula:

$$\Delta\theta = (\varphi/2) \cdot ((A-B)/(A+B))$$

wherein $\Delta\theta$ is the channel phase correction, $\varphi$ is the channel phase difference, A is the amplitude of the first channel, and B is the amplitude of the second channel.

8. The dual channel differential sensor of claim 1, wherein the sensing circuit is further configured to:
determine a first channel angle based at least in part on the first component signal and the third component signal;
determine a second channel angle based at least in part on the second component signal and the fourth component signal;
determine a cross-channel angle difference based at least in part on the first channel angle and the second channel angle;
determine that the cross-channel angle difference is not within a cross-channel correlation tolerance margin; and
in response to determining that the cross-channel angle difference is not within the cross-channel correlation tolerance margin, perform one or more correction control actions.

9. The dual channel differential sensor of claim 1, wherein at least one of the first channel or the second channel comprises:
one or more coils configured to interact with a target and produce one or more coil signatures in response to interaction with the target;
channel circuitry configured to produce one or more component signals in response to the one or more coil signatures; and
an interface configured to provide the one or more component signals.

10. The dual channel differential sensor of claim 9, wherein the one or more coils comprises a receive coil and a transmit coil.

11. The dual channel differential sensor of claim 9, wherein channel circuitry associated with the first channel is disposed in a first integrated circuit and channel circuitry associated with the second channel is disposed in a second integrated circuit, the second integrated circuit being different from the first integrated circuit.

12. method for operating a dual channel differential sensor, the method comprising:
obtaining a first component signal from a first channel of a dual channel differential sensor and a second component signal from a second channel of the dual channel differential sensor, the first component signal having a first polarity and the second component signal having a second polarity, the second polarity opposing the first polarity;
obtaining a third component signal from the first channel of the dual channel differential sensor and a fourth component signal from the second channel of the dual channel differential sensor, the third component signal having the first polarity and the fourth component signal having the second polarity:
determining a first cross-channel differential signal based at least in part on the first component signal and the second component signal;
providing the first cross-channel differential signal as an output of the dual channel differential sensor:
determining a second cross-channel differential signal based at least in part on the third component signal and the fourth component signal; and
providing the second cross-channel differential signal as an output of the dual channel differential sensor.

13. The method of claim 12, further comprising:
determining a first channel angle based at least in part on the first component signal and the third component signal;
determining a second channel angle based at least in part on the second component signal and the fourth component signal;
determining a cross-channel angle difference based at least in part on the first channel angle and the second channel angle;
determining that the cross-channel angle difference is not within a cross-channel correlation tolerance margin; and in response to determining that the cross-channel angle difference is not within the cross-channel correlation tolerance margin, performing one or more correction control actions.

* * * * *